(12) United States Patent
Loh et al.

(10) Patent No.: US 7,646,035 B2
(45) Date of Patent: Jan. 12, 2010

(54) PACKAGED LIGHT EMITTING DEVICES INCLUDING MULTIPLE INDEX LENSES AND MULTIPLE INDEX LENSES FOR PACKAGED LIGHT EMITTING DEVICES

(75) Inventors: Ban P. Loh, Durham, NC (US); Nicholas W. Medendorp, Jr., Raleigh, NC (US); Bernd Keller, Santa Barbara, CA (US)

(73) Assignee: Cree, Inc., Durham, NC (US)

( * ) Notice: Subject to any disclaimer, the term of this patent is extended or adjusted under 35 U.S.C. 154(b) by 338 days.

(21) Appl. No.: 11/443,741

(22) Filed: May 31, 2006

(65) Prior Publication Data

US 2007/0278512 A1 Dec. 6, 2007

(51) Int. Cl.
H01L 29/16 (2006.01)
(52) U.S. Cl. .................. 257/99; 257/100; 257/E33.073
(58) Field of Classification Search .................. 257/99, 257/100
See application file for complete search history.

(56) References Cited

U.S. PATENT DOCUMENTS

| | | | |
|---|---|---|---|
| 3,547,214 A | 12/1970 | Ravenel |
| 3,875,456 A | 4/1975 | Kano et al. |
| 4,152,044 A | 5/1979 | Liu |
| 4,427,213 A | 1/1984 | Raidel, Jr. |
| 4,566,719 A | 1/1986 | Van Denberg |
| 4,918,497 A | 4/1990 | Edmond |
| 4,966,862 A | 10/1990 | Edmond |
| 5,002,305 A | 3/1991 | Raidel |
| 5,027,168 A | 6/1991 | Edmond |
| 5,037,126 A | 8/1991 | Gottschalk et al. |
| 5,127,668 A | 7/1992 | Raidel |
| 5,210,051 A | 5/1993 | Carter, Jr. |
| 5,338,944 A | 8/1994 | Edmond et al. |
| 5,393,993 A | 2/1995 | Edmond et al. |
| 5,416,342 A | 5/1995 | Edmond et al. |
| 5,523,589 A | 6/1996 | Edmond et al. |

(Continued)

FOREIGN PATENT DOCUMENTS

JP  05-100106  4/1993

(Continued)

OTHER PUBLICATIONS

International Search Report and Written Opinion of the International Searching Authority for International Patent Application No. PCT/US2005/009779 mailed on Feb. 28, 2006.

(Continued)

*Primary Examiner*—Kenneth A Parker
*Assistant Examiner*—Anthony Ho
(74) *Attorney, Agent, or Firm*—Myers Bigel Sibley & Sajovec (57) ABSTRACT

A packaged light emitting device includes a substrate, a solid state light emitting device on the substrate, a first generally toroidal lens on the substrate and defining a cavity relative to the solid state light emitting device and having a first index of refraction, and a second lens at least partially within the cavity formed by the first lens and having a second index of refraction that is different from the first index of refraction. The second index of refraction may be higher than the first index of refraction. The lenses may be mounted on the substrate and/or may formed by dispensing and curing liquid encapsulant materials.

22 Claims, 8 Drawing Sheets

U.S. PATENT DOCUMENTS

| | | | |
|---|---|---|---|
| 5,604,135 | A | 2/1997 | Edmond et al. ............... 437/22 |
| 5,631,190 | A | 5/1997 | Negley |
| 5,739,554 | A | 4/1998 | Edmond et al. |
| 5,912,477 | A | 6/1999 | Negley |
| 6,120,600 | A | 9/2000 | Edmond et al. |
| 6,187,606 | B1 | 2/2001 | Edmond et al. |
| 6,201,262 | B1 | 3/2001 | Edmond et al. |
| 6,489,637 | B1 | 12/2002 | Sakamoto et al. |
| 6,521,916 | B2 | 2/2003 | Roberts et al. |
| 6,610,563 | B1 | 8/2003 | Waitl et al. |
| 6,746,889 | B1 | 6/2004 | Eliashevich et al. |
| 6,784,463 | B2 | 8/2004 | Camras et al. |
| 7,087,936 | B2 | 8/2006 | Negley |
| 7,355,284 | B2 | 4/2008 | Negley |
| 2002/0015013 | A1 | 2/2002 | Ragle |
| 2003/0141510 | A1 | 7/2003 | Brunner et al. |
| 2004/0061120 | A1 | 4/2004 | Mizuyoshi |
| 2004/0096666 | A1 | 5/2004 | Knox et al. |
| 2005/0058947 | A1 | 3/2005 | Rinehart et al. |
| 2005/0058948 | A1 | 3/2005 | Freese et al. |
| 2005/0058949 | A1 | 3/2005 | Wood et al. |
| 2005/0168689 | A1 | 8/2005 | Knox |
| 2005/0218421 | A1 | 10/2005 | Andrews et al. |
| 2005/0224829 | A1* | 10/2005 | Negley et al. ............... 257/99 |
| 2006/0006404 | A1 | 1/2006 | Ibbetson et al. |
| 2006/0034082 | A1 | 2/2006 | Park et al. |
| 2006/0061869 | A1 | 3/2006 | Fadel et al. |
| 2006/0081862 | A1 | 4/2006 | Chua et al. |
| 2006/0114569 | A1 | 6/2006 | Capaldo et al. |
| 2006/0164729 | A1 | 7/2006 | Wood |
| 2006/0275714 | A1 | 12/2006 | Rinehart et al. |
| 2006/0285332 | A1 | 12/2006 | Goon et al. |
| 2007/0003868 | A1 | 1/2007 | Wood et al. |
| 2007/0008738 | A1 | 1/2007 | Han et al. |
| 2007/0014004 | A1 | 1/2007 | Wood |
| 2007/0047204 | A1 | 3/2007 | Parker et al. |
| 2007/0127098 | A1 | 6/2007 | Wood |
| 2007/0127129 | A1 | 6/2007 | Wood et al. |

FOREIGN PATENT DOCUMENTS

| | | | |
|---|---|---|---|
| JP | | 08032120 | 2/1996 |
| JP | | 09027643 | 1/1997 |
| KR | | 10-0580753 B1 | 5/2006 |
| WO | | WO 01/15242 | 3/2001 |
| WO | | WO 02/068227 | 9/2002 |
| WO | | WO 03/069685 A2 | 8/2003 |
| WO | | WO 2004/068594 | 8/2004 |
| WO | | WO 2005/098975 A2 | 10/2005 |
| WO | | WO 2007/026776 | 3/2007 |

OTHER PUBLICATIONS

U.S. Appl. No. 11/197,096, filed Aug. 4, 2005, entitled *Packages for Semiconductor Light Emitting Devices Utilizing Dispensed Encapsulants and Methods of Packaging the Same.*

*Information about Dow Corning® Brand LED Materials: Silicones and Electronics*, Dow Corning Corporation, 2005.

International Search Report and Written Opinion for PCT/US2007/011325; Nov. 15, 2007.

U.S. Appl. No. 11/753,103, filed May 24, 2007, Negley.

U.S. Appl. No. 12/174,053, filed Jul. 16, 2008, Negley.

International Search Report and Written Opinion (13 pages) corresponding to International Application No. PCT/US07/12403; Mailing Date: Aug. 6, 2008.

International Search Report and Written Opinion (14 pages) corresponding to International Application No. PCT/US2008/070132; Mailing Date: Oct. 14, 2008.

\* cited by examiner

PACKAGED LIGHT EMITTING DEVICES INCLUDING MULTIPLE INDEX LENSES AND MULTIPLE INDEX LENSES FOR PACKAGED LIGHT EMITTING DEVICES

FIELD OF THE INVENTION

This invention relates to semiconductor light emitting devices and fabrication methods therefor, and more particularly to packaging and packaging methods for semiconductor light emitting devices.

BACKGROUND

Figure 1:
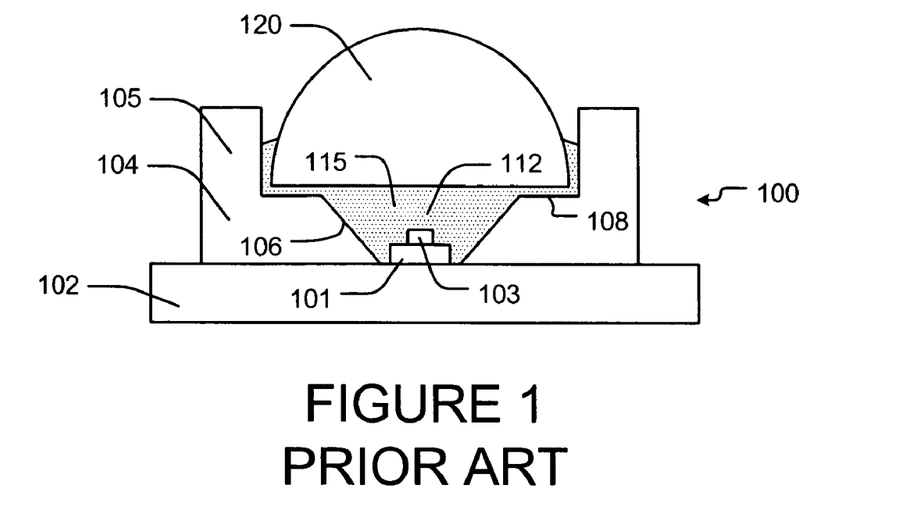
FIG. 1 is a cross-sectional side view illustrating a conventional light emitting device package.

It is known to provide solid state light sources in packages that may provide protection, color selection, focusing and the like for light emitted by the light emitting device. For example, the solid state light source may be a light emitting diode ("LED"). Various problems may be encountered during packaging of a power LED for use as a light source. Examples of such possible problems will be described with reference to the cross-sectional illustration of an LED in FIG. 1. As shown in FIG. 1, an LED package 100 generally includes a substrate member 102 on which a light emitting device 103 is mounted. The light emitting device 103 may, for example, be mounted on the substrate member 102 using a submount 101. The LED device may be bonded with wire(s) to connect its terminals to the electrical terminals in the substrate to be powered up. The substrate member 102 may include traces or metal leads for connecting the package 100 to external circuitry. The substrate 102 may also act as a heatsink to conduct heat away from the LED 103 during operation.

A reflector, such as the reflector cup 104, may be mounted on the substrate 102 and surround the light emitting device 103 which may be assembled on the substrate 102 for ease of manufacturability. The reflector cup 104 illustrated in FIG. 1 includes an angled or sloped lower sidewall 106 for reflecting light generated by the LED 103 upwardly and away from the LED package 100. The illustrated reflector cup 104 also includes upwardly-extending walls 105 that may act as a channel for holding a lens 120 in the LED package 100, and a horizontal shoulder portion 108 for directly or indirectly positioning the lens 120 at a desired height above the light emitting device 103. The upwardly extending walls 105 may also help protect the lens 120 from mechanical shock and stress.

As illustrated in FIG. 1, after the reflector 104 is mounted on the substrate 102, an encapsulant material 112, such as liquid silicone gel, is dispensed into an interior reflective cavity 115 defined by the reflector cup 104. The interior reflective cavity 115 illustrated in FIG. 1 has a bottom surface defined by the substrate 102 to provide a closed cavity capable of retaining a liquid encapsulant material 112 therein.

Figure 2:
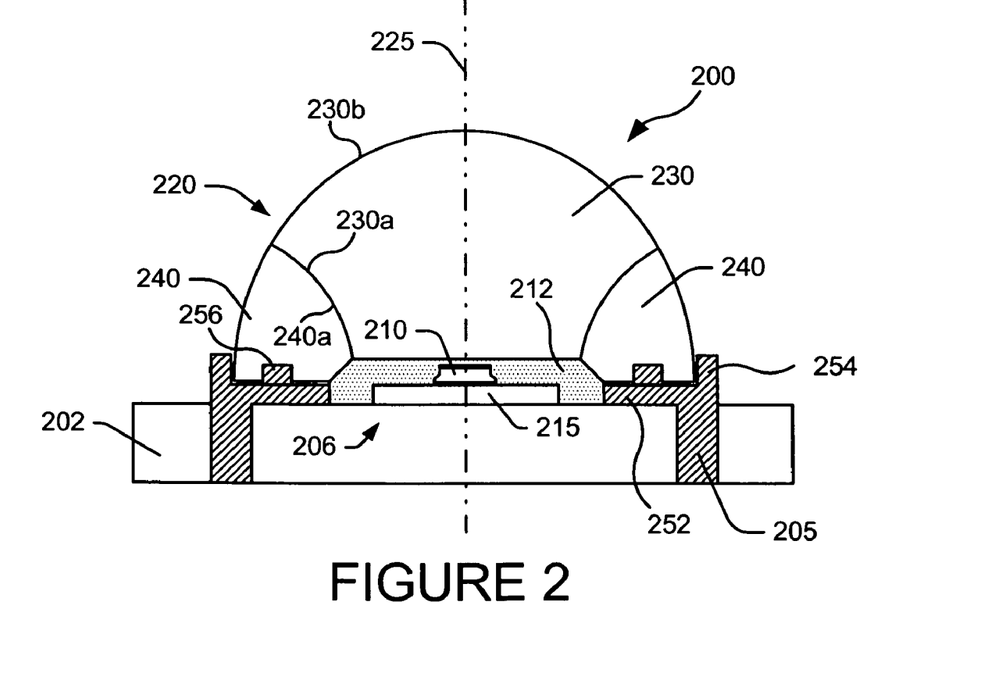
FIG. 2 is a cross-sectional side view illustrating a light emitting device package according to some embodiments of the invention.

After placement of the lens 120, the package 100 is typically heat-cured, which causes the encapsulant material 112 to solidify and adhere to the lens 120. The lens 120 may, thus, be held in place by the cured encapsulant material 112. However, encapsulant materials having a slight shrinkage factor with curing, such as a silicone gel, generally tend to contract during the heat curing process. In addition, the coefficient of thermal expansion (CTE) effect generally causes higher floating of the lens at elevated temperatures. During cool-down, parts may have a tendency to contract. As the illustrated volume of encapsulant beneath the lens 120 shown in FIG. 2 is relatively large, this contraction may cause the encapsulant material 112 to delaminate (pull away) from portions of the package 100, including the light emitting device 103, a surface of the substrate 102, the upwardly-extending walls 105 of the reflector cup 104 and/or the lens 120 during the curing process. This delamination may significantly affect the optical performance of the package 100, particularly when the delamination is from the die, where it may cause total internal reflection to occur that may trap light in the package 100. This contraction may also create gaps or voids between the encapsulant material 112 and the light emitting device 103, lens 120, and/or reflector cup 104. Tri-axial stresses in the encapsulant material 112 may also cause cohesive tears in the encapsulant material 112. These gaps and/or tears may substantially reduce the amount of light emitted by the light emitting device package 100. The contraction may also pull out air pockets from crevices (e.g., beneath the reflector) or from under devices (e.g., the die/submount), which may then interfere with the optical performance of the package 100.

During operation of the package 100, large amounts of heat may be generated by the light emitting device 103. Much of the heat may be dissipated by the substrate 102 and the reflector cup 104, each of which may act as a heatsink for the package 100. However, the temperature of the package 100 may still increase significantly during operation. Encapsulant materials 112, such as silicone gels, typically have high coefficients of thermal expansion. As a result, when the package 100 heats up, the encapsulant material 112 may expand. As the lens 120 is mounted within a channel defined by the upwardly-extending walls 105 of the reflector cup 104, the lens 120 may travel up and down within the upwardly-extending walls 105 as the encapsulant material 112 expands and contracts. Expansion of the encapsulant material 112 may extrude the encapsulant into spaces or out of the cavity such that, when cooled, it may not readily move back into the cavity. This could cause delamination, voids, higher triaxial stresses and/or the like, which may result in less robust light emitting devices. Such lens movement is further described, for example, in United States Patent Application Pub. No. 2004/0041222.

In addition, during operation of the device, some light is emitted by the light emitting device 103 toward the lower sidewalls 106 of the reflector cup 104. Most light incident upon the lower sidewalls 106 will be reflected upward and out of the optical cavity 115 defined by the reflector cup 104. However, some of the light incident upon the lower sidewalls 106 will be absorbed, leading to increased heating and/or optical losses. For example, in typical LED packages, the reflector cup may include a metal such as copper plated with a reflective metal such as silver, or an injection molded plastic coated with a reflective metal layer, such as an aluminum or silver layer. A highly specular silver surface may reflect only about 96% of incident light, while about 4% of the incident light may be absorbed. Furthermore, as the metal surface oxidizes over time, the reflectivity of the metal may decrease further.

The presence of the relatively high vertical walls 105 for mechanical protection and lens alignment may further contribute to optical losses in the package 100 and/or may result in an undesirable light emission pattern.

SUMMARY

A packaged light emitting device according to some embodiments of the invention includes a substrate, a solid state light emitting device on the substrate, a first lens on the substrate and defining a cavity above the solid state light emitting device and having a first index of refraction, and a second lens positioned at least partially within the cavity formed by the first lens and having a second index of refraction that is different from the first index of refraction. The second index of refraction may be higher than the first index of refraction.

The packaged light emitting device may further include an encapsulant material between the solid state light emitting device and the second lens.

The substrate may include a leadframe or a printed circuit board, such as an alumina-based printed circuit board and the packaged light emitting device may further include a molded body on the substrate. The first lens may be a premolded lens that is bonded to the molded body and/or the substrate. The molded body may include at least one horizontal surface that extends along the substrate surface and/or at least one vertical sidewall extending from the horizontal surface and defining a mounting location for the first lens. The molded body may extend at least partially through the leadframe.

The first lens may include a first mating surface and the second lens may include a second mating surface that may be in contact with the first mating surface of the first lens. The second lens may be attached to the first lens using an adhesive encapsulant that may have an index of refraction that is substantially the same as the first index of refraction or the second index of refraction.

The packaged light emitting device may further include a third lens positioned on the second lens and having a third index of refraction. The third index of refraction may be higher than the first index of refraction and/or the second index of refraction. In some embodiments, the third index of refraction may be higher than the first index of refraction and may be the same as the second index of refraction.

Some embodiments of the invention provide a solid state luminaire including a packaged light emitting device as described above and/or a backlight panel for a display including a packaged light emitting device as described above.

Some embodiments of the invention provide a lens for a packaged light emitting device including a generally toroidal side lens defining a cavity therein and having a first index of refraction, and a core lens positioned at least partially within the cavity formed by the side lens and having a second index of refraction that is different from the first index of refraction. The second index of refraction may be higher than the first index of refraction.

The lens may further include a third lens positioned on the second lens and having a third index of refraction. The third index of refraction may be higher than the first index of refraction and/or the second index of refraction. The third index of refraction may be higher than the first index of refraction and may be the same as the second index of refraction.

A packaged light emitting device according to further embodiments of the invention includes a substrate having a surface, and a die attach pad configured to receive a solid state light emitting device on the surface of the substrate. A first meniscus control feature is on the substrate. The first meniscus control feature surrounds the die attach pad and is configured to limit the flow of liquid encapsulant material. A second meniscus control feature on the substrate surrounds the first meniscus control feature and is configured to limit the flow of liquid encapsulant material. The first meniscus control feature and the second meniscus control feature define an encapsulant region of the upper surface of the substrate surrounding the first encapsulant region.

A solid state light emitting device is on the die attach pad, and a first encapsulant is on the substrate within the encapsulant region defined by the first meniscus control feature and the second meniscus control feature. The first encapsulant has a first index of refraction and defines a cavity above the solid state light emitting device. A second encapsulant is within the cavity. The second encapsulant has a second index of refraction that may be different from the first index of refraction. The second index of refraction may be higher than the first index of refraction.

The packaged light emitting device may further include a third meniscus control feature surrounding the second meniscus control feature and a third encapsulant on the substrate within a region defined by the third meniscus control feature. The third encapsulant covers the first encapsulant and the second encapsulant and has a third index of refraction that is different from the first index of refraction or the second index of refraction.

The third index of refraction may be higher than the first index of refraction and/or the second index of refraction. In some embodiments, the third index of refraction may be higher than the first index of refraction and may be the same as the second index of refraction.

The first, second and/or third encapsulant may include silicone gel and/or epoxy resin, and/or may include a wavelength conversion material.

Methods of forming a packaged light emitting device according to some embodiments of the invention include forming a patterned metal film including a die attach pad on a substrate, forming a first meniscus control feature on the substrate surrounding the die attach pad and configured to limit the flow of encapsulant material, and forming a second meniscus control feature on the substrate surrounding the first encapsulant region and configured to limit the flow of encapsulant material, the first meniscus control feature and the second meniscus control feature define an encapsulant region of the upper surface of the substrate.

A solid state light emitting device is mounted on the die attach pad, and a first encapsulant material is dispensed within the encapsulant region defined by the first meniscus control feature and the second meniscus control feature. The first encapsulant material has a first index of refraction and defines a cavity above the solid state light emitting device. The first encapsulant material is at least partially cured, and a second encapsulant material is dispensed within the cavity defined by the first encapsulant material. The second encapsulant material has a second index of refraction that is different from the first index of refraction. For example, the second index of refraction may be higher than the first index of refraction.

The methods may further include forming a third meniscus control feature on the substrate surrounding the second meniscus control feature, and dispensing a third encapsulant material within a region defined by the third meniscus control feature. The third encapsulant material has a third index of refraction that is different from the first index of refraction or the second index of refraction.

The third index of refraction may be higher than the first index of refraction and/or the second index of refraction. In some embodiments, the third index of refraction may be higher than the first index of refraction and may be the same as the second index of refraction.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. It will be understood that if part of an element, such as a surface, is referred to as "inner," it is farther from the outside of the device than other parts of the element. Furthermore, relative terms such as "horizontal" or "vertical" or "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Various embodiments of the present invention for packaging a semiconductor light emitting device will be described herein. As used herein, the term semiconductor light emitting device may include a light emitting diode, laser diode and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive layers. In some embodiments, ultraviolet, blue and/or green light emitting diodes ("LEDs") may be provided. Red and/or amber LEDs may also be provided. The design and fabrication of semiconductor light emitting devices are well known to those having skill in the art and need not be described in detail herein.

For example, the semiconductor light emitting device may be gallium nitride-based LEDs or lasers fabricated on a silicon carbide substrate such as those devices manufactured and sold by Cree, Inc. of Durham, N.C. The present invention may be suitable for use with LEDs and/or lasers as described in U.S. Pat. Nos. 6,201,262; 6,187,606; 6,120,600; 5,912,477; 5,739,554; 5,631,190; 5,604,135; 5,523,589; 5,416,342; 5,393,993; 5,338,944; 5,210,051; 5,027,168; 5,027,168; 4,966,862 and/or 4,918,497, the disclosures of which are incorporated herein by reference as if set forth fully herein. Other suitable LEDs and/or lasers are described in published U.S. Patent Publication No. US 2003/0006418 A1 entitled Group III Nitride Based Light Emitting Diode Structures With a Quantum Well and Superlattice, Group III Nitride Based Quantum Well Structures and Group III Nitride Based Superlattice Structures, published Jan. 9, 2003, as well as published U.S. Patent Publication No. US 2002/0123164 A1 entitled Light Emitting Diodes Including Modifications for Light Extraction and Manufacturing Methods Therefor. Furthermore, phosphor coated LEDs, such as those described in U.S. Pat. No. 6,853,010, the disclosure of which is incorporated by reference herein as if set forth fully, may also be suitable for use in embodiments of the present invention. The LEDs and/or lasers may be configured to operate such that light emission occurs through the substrate. In such embodiments, the substrate may be patterned so as to enhance light output of the devices as is described, for example, in the above-cited U.S. Patent Publication No. US 2002/0123164 A1.

Embodiments of the present invention will now be described with reference to the various embodiments illustrated in FIGS. 2-12. Referring now to FIG. 2, a package 200 for a light emitting diode according to some embodiments of the invention is illustrated. The package 200 includes a substrate 202 on which an LED chip 210 is mounted. As used herein, the term "LED chip" refers to an unmounted light emitting diode. As shown in FIG. 2, the LED chip 210 may be provided on a submount 215, and the entire LED/submount assembly may be mounted on the substrate 202. While a single LED chip is shown in FIG. 2, it will be understood that more than one LED chip 210 and/or submount 215 may be provided on the substrate 202.

According to some embodiments of the invention, a dual index lens 220 is provided above the LED chip 210. Light emitted by the LED chip 210 passes through the dual index lens 220 and is focused by the lens 220 to create a desired near-field or far-field optical pattern. The dual index lens 220 includes a first portion 230 having a first index of refraction and a second portion 240 having a second index of refraction that is different from the first index of refraction. The first portion 230 and second portion 240 of the lens 220 define an interface therebetween at which light may be reflected and/or refracted to provide a desired optical emission pattern and/or to increase light extraction from the package 200.

In the embodiments illustrated in FIG. 2, the dual index lens 220 includes a side lens 240 and a core lens 230. The side lens 240 has a generally toroidal shape, and is positioned above the substrate 200 around an axis 205 above the LED chip 210. In general, a toroidal surface is a surface generated by a plane closed curve rotated about a line that lies in the same plane as the curve but does not intersect it. In the embodiments of FIG. 2. the toroidal side lens 240 may thought of as formed of a plane closed curve rotated about the axis 205.

The side lens 240 may be formed, for example, of a plastic or polymer material, such as silicone, and has a first index of refraction. In some embodiments, the side lens 240 may have an index of refraction of about 1.4. In particular embodiments, the side lens 240 may have an index of refraction of about 1.41.

The side lens 240 may be mounted on a package body 205 that is provided on the substrate 202. Portions of the package body 205 may extend through the substrate 202. In some embodiments, the substrate 202 includes a metal leadframe, and the package body 205 may be formed on the leadframe, for example, by injection molding. In other embodiments, the substrate 202 may include a printed circuit board such as an alumina-based printed circuit board. The package body 205 may include a horizontal portion 252 extending along the surface of the substrate 202 and vertical portions 254, 256 extending upwards and away from the horizontal portion 252. The package body 205 may surround a die mounting region 206 of the substrate 202 on which the submount 215 and LED chip 210 are mounted.

The side lens 240 may be positioned on the horizontal portion 252 of the package body 205. The vertical portions 254, 256 of the package body may assist with registration of the side lens 240 above the LED chip 210. The side lens 240 may be affixed to the package body 205, for example, using an epoxy adhesive.

The side lens 240 includes an inner mating surface 240a, which, in the embodiments illustrated in FIG. 2, curves upward and away from the die mounting region 206 of the substrate 202.

A core lens 230 is positioned above the die mounting region 206 in the central space defined by the toroidal side lens 240. The core lens 230 may be formed, for example, of a plastic or polymer material, such as silicone, and has a second index of refraction that is greater than the first index of refraction of the side lens 240. In some embodiments, the core lens 230 may have an index of refraction of about 1.5. In particular embodiments, the core lens 230 may have an index of refraction of about 1.52.

The core lens 230 may include an outer surface 230b and a mating surface 230a. The shape of the mating surface 230a is formed to match the shape of the corresponding mating surface 240a of the side lens 240. The shape of the mating surfaces 230a, 240a may be chosen to provide a desired optical pattern of light emitted by the package 200. In the embodiments illustrated in FIG. 2, the mating surface 230a of the core lens 230 has a generally convex shape, while the mating surface 240a of the side lens 240 has a generally concave shape that is the inverse or reciprocal of the shape of the mating surface 230a of the core lens 230.

An encapsulant material 212 may be provided between the LED chip 210 and the lens 220. The encapsulant material 212 may include an optically clear material such as a silicone and/or an epoxy. The encapsulant material 212 may or may not include a wavelength conversion material such as a phosphor. In some embodiments, the LED chip 210 may be coated with a phosphor for wavelength conversion. Furthermore, the encapsulant material 212 may include other materials, such as dispersers and/or diffusers.

The outer surface 230b of the core lens 230 is shaped to provide a desired optical pattern, and in some cases may be substantially dome-shaped, as shown in FIG. 2. Other shapes are possible, depending on the desired optical emission pattern of the package 200. In some embodiments, the side lens 240 and the core lens 230 may be affixed and/or formed together to form a lens 220 prior to mounting the lens 220 onto the substrate 202.

Figure 3A:
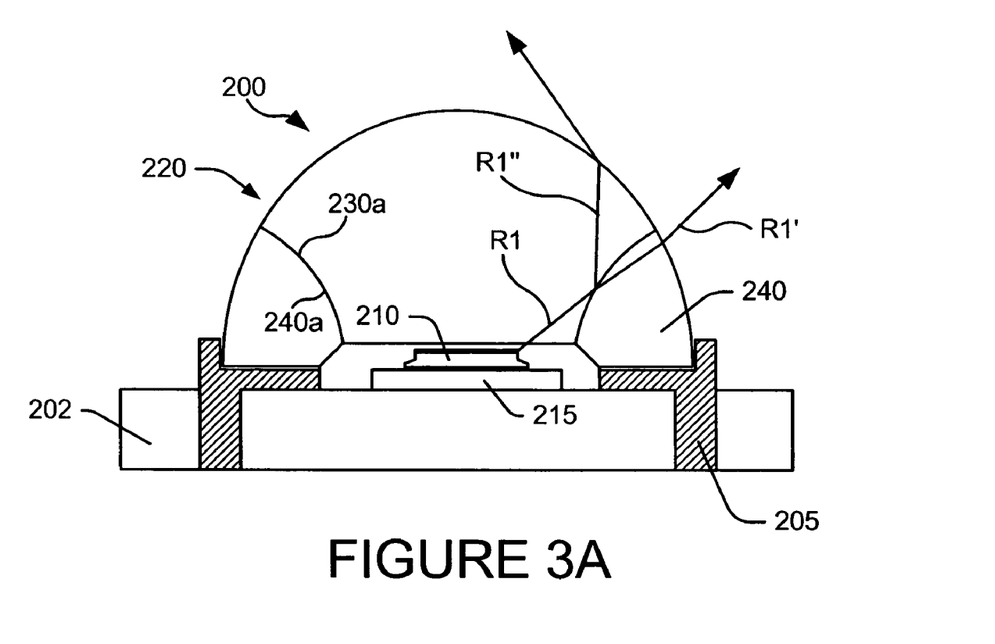
FIGS. 3A to 3B are cross-sectional side views illustrating a light emitting device package according to some embodiments of the invention.
Figure 3B:
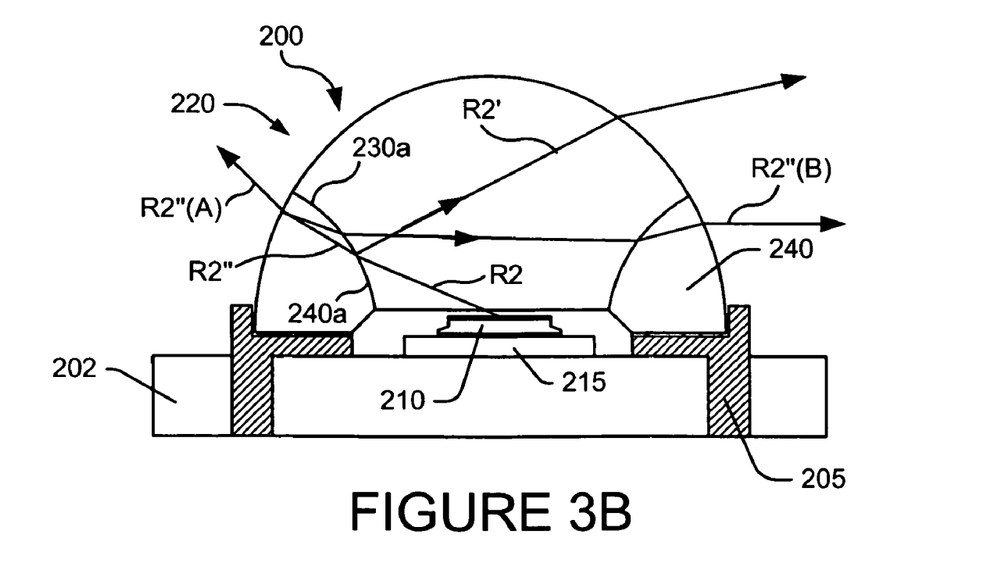

Referring to FIGS. 3A and 3B, when a light ray, such as light ray R1 strikes the interface 235 between the core lens 230 and the side lens 240 (i.e. where the mating surface 230a of the core lens 230 and the mating surface 240a of the side lens 240 are in contact), a portion of the light ray R1' may be refracted at the interface 235, while another portion of the incident light ray R1" may be reflected due to total internal reflection and the interface.

As is known in the art, the difference of index of refraction between the side lens 240 and the core lens 230 may cause total internal reflection of light rays passing through the higher-index material (in this case, the core lens 230) that strike the interface at an angle greater than the critical angle defined by arcsin(n1/n2), where n1 and n2 represent the indices of refraction of the side lens 240 and the core lens 230, respectively, and n2>n1. However, even when a light ray is totally internally reflected at the interface, some portion of the ray may pass through the interface and be refracted. Thus, as shown in FIG. 3A, a light ray R1' may be refracted at the interface 235 between the core lens 230 and the side lens 240. However, as further illustrated in FIG. 3A, the light ray R1' may escape the lens 220 through the side lens 240, and may form part of the useful light emission of the package 200, thereby increasing the efficiency of the package.

Similarly, even if a light ray strikes the interface at an angle that is less than the critical angle, some portion of the light ray may be reflected at the interface. For example, referring to FIG. 3B, a light ray R2 that strikes the interface 235 between the core lens 230 and the side lens 240 may be split into a ray R1' that is reflected at the interface 235 and a ray R2" that is refracted at the interface 235. Moreover, the ray R2" that is refracted at the interface 235 and that passes into the side lens 140 may again be split into a refracted portion R2"(A) and a reflected portion R2"(B) at the outer surface of the side lens 240. However, as illustrated in FIG. 3B, the reflected portion R2"(B) may pass back through the side lens 240 and into the core lens 230. The reflected portion R2"(B) may not be totally internally reflected at the interface 235 when it passes back into the core lens 230 if the core lens has a higher index of refraction than the side lens 240. The reflected portion R2"(B) may then be extracted from the package 200 through the core lens 230 or the side lens 240.

Figure 4A:
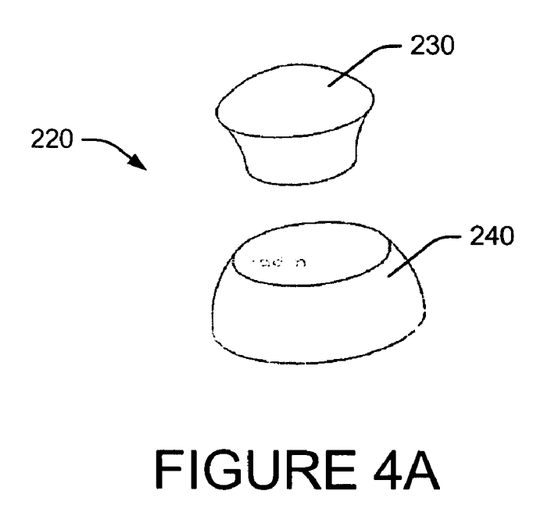
FIGS. 4A and 4B are perspective views illustrating a two-piece lens according to some embodiments of the present invention.
Figure 4B:
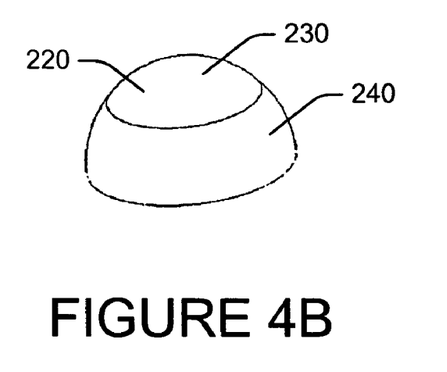

FIGS. 4A and 4B are perspective views of a dual index lens 220 including a side lens 240 and a core lens 230. As shown in FIGS. 4A and 4B, the core lens 230 may be inserted into the side lens 240 such that the mating surface 230a of the core lens fits flush against the corresponding mating surface 240a of the side lens 240.

Figure 5:
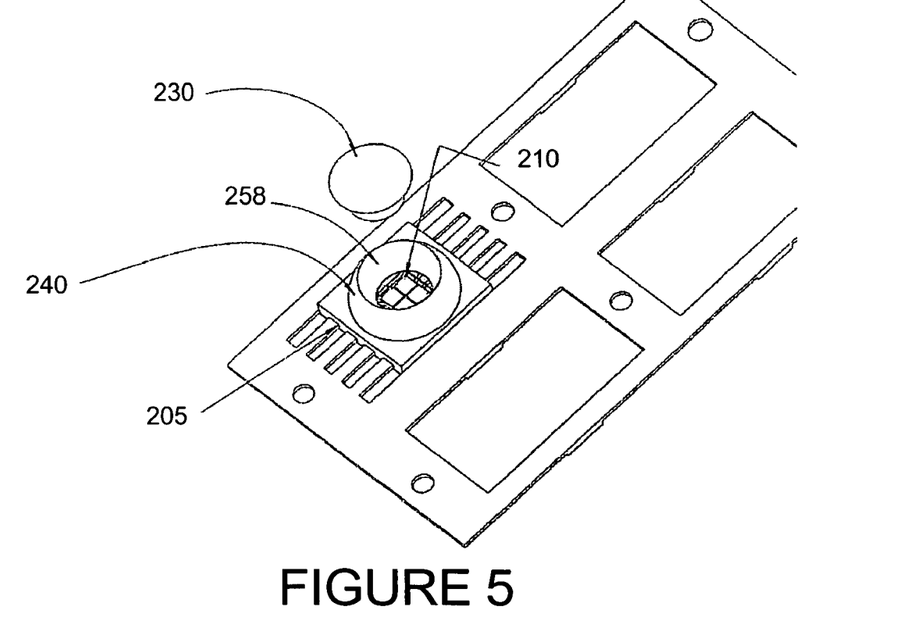
FIG. 5 is a perspective view illustrating the assembly of a light emitting device package according to some embodiments of the present invention.

Referring to FIGS. 2, 4A-4B, and 5, the core lens 230 may be inserted into the side lens 240 before or after the side lens 240 is mounted on the package housing 205. However, in some embodiments, the side lens 240 may be mounted onto the package body 205 before the core lens 230 is inserted into the side lens 240. As shown in FIG. 5, the package body 5 may be formed on a structure that includes a leadframe 202 supported by a support frame 280.

The side lens 240 is mounted to the package body 205 using, for example, an epoxy resin. Before or after the side lens 240 is mounted on the package body 205, one or more LED chips 210 may be mounted on the package body 205.

An encapsulant 212 may be dispensed into the cavity defined by the side lens 240. The core lens 230 may then be inserted into the side lens 240 to form the composite dual-index lens 220. The core lens 230 may be affixed to the side lens 240 using a clear epoxy or silicone at the interface 235 between the core lens 230 and the side lens 240. The material used to seal the interface 235 between the core lens 230 and the side lens 240 may have an index of refraction that is the same as the index of refraction of the core lens 230 or the side lens 240, or that is in between the indices of refraction of the core lens 230 and the side lens 240.

Figure 6:
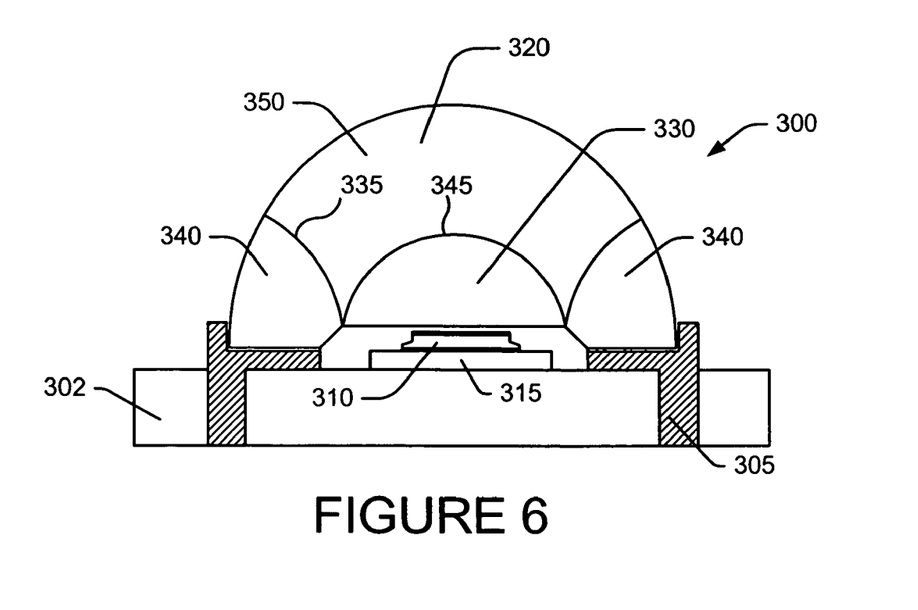
FIG. 6 is a cross-sectional side view illustrating a light emitting device package according to further embodiments of the present invention.

Further embodiments of the invention are illustrated in FIG. 6. As shown therein, an LED package 300 includes a substrate 302 and a package body 305. At least one light emitting device 310 is mounted on the substrate 302. The package 300 includes a composite lens 320 having three portions, each of which may have a different index of refraction. In the embodiments illustrated in FIG. 6, the lens 320 includes an inner lens 330 positioned above the light emitting diode 310 and having a first index of refraction, and a side lens 340 on the package body and surrounding the inner lens 330 and having a second index of refraction that may be the same as or different from the first index of refraction. In some embodiments, the side lens 340 may have an index of refraction of about 1.4, while the inner lens 330 may have an index of refraction of between about 1.4 and about 1.5.

An outer lens 350 is on the inner lens 330. The outer lens 350 forms a first interface 335 with the inner lens 330 and a second interface 345 with the side lens 340. The outer lens 350 has a third index of refraction, which may be different from the first index of refraction. In some embodiments, the outer lens 350 may have an index of refraction of about 1.5. Light passing through the lens 320 may be refracted and/or reflected at one or more of the interfaces 335, 345 to form a desired optical emission pattern.

Referring to FIGS. 7A-7D, further embodiments according to the invention are illustrated in which a multiple-index lens is formed by dispensing and curing of encapsulant material. Formation of optical features of a light emitting diode package is described, for example, in U.S. patent application Ser. No. 11/197,096, entitled "Packages for Semiconductor Light Emitting Devices Utilizing Dispensed Encapsulants and Methods of Packaging the Same", the disclosure of which is incorporated herein by reference in its entirety.

The formation of a package for an LED chip 414 according to some embodiments of the invention is illustrated in FIGS. 7A-7D. The package includes a substrate 402 having an upper surface and a lower surface. The substrate 402 may include a printed circuit board (PCB), an aluminum block, an alumina, aluminum nitride or silicon wafer, or any other suitable substrate material, such as T-Clad thermal clad insulated substrate material, available from The Bergquist Company of Chanhassen, Minn.

A plurality of metal features are formed on the upper surface of the substrate 402, for example, by a plating process. For example, as with the embodiment illustrated in FIGS. 7A-7D, the package 400 may include a die attach pad 412, a wire bond pad 423, a first meniscus control feature 410 defining a first encapsulant region 405, and a second meniscus control feature 420 defining an annular second encapsulant region 415 between the first meniscus control feature 410 and the second meniscus control feature 420. In addition, a third meniscus control feature 430 surrounds the second meniscus control feature 420 and defines a third encapsulant region 425 including the first encapsulant region 405 and the second encapsulant region 415. While the features on the substrate 200 such as the first, second and third meniscus control features 410, 420, 430 are illustrated as being substantial circular in shape, the features may have other regular and/or irregular shapes depending on the desired light emission characteristics of the package.

Figure 7A:
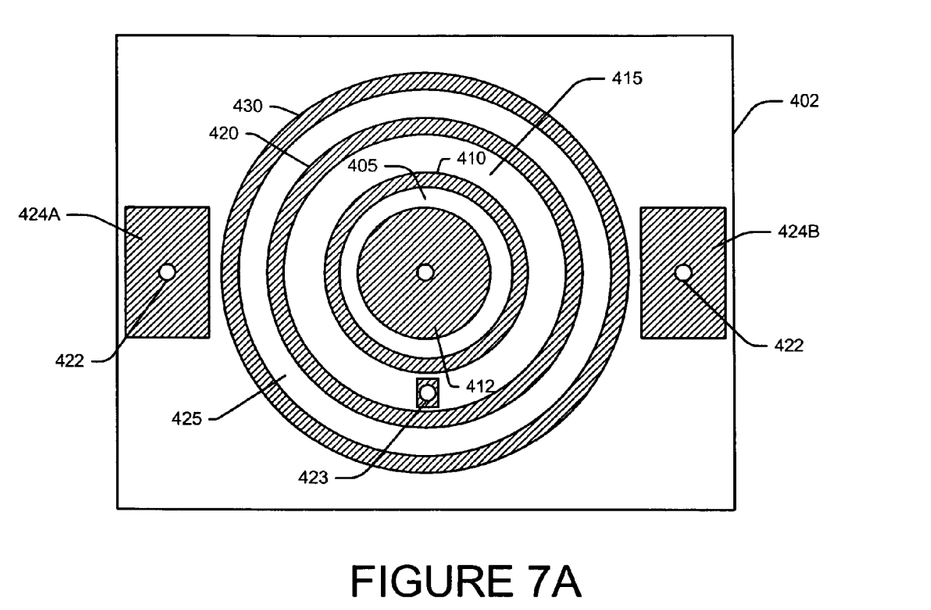
FIG. 7A is a top view of a substrate for a light emitting device package according to further embodiments of the invention.

The meniscus control features 410, 420, 430, the die attach pad 412 and the wirebond pad 423 may include metal traces formed on the substrate 402. However, in some embodiments, the meniscus control features 410, 420, 430 may include a material different from the die attach pad 412 and the wirebond pad 423. For example, the meniscus control features 410, 420, 430 may include a polymer such as polyimide.

A plurality of conductive vias 422 may provide electrical contact between features formed on opposite sides of a substrate. Accordingly, respective conductive features formed on the upper surface of substrate 402 may be formed of the same material. For example, the conductive features may include copper deposited using a plating process. However, in some embodiments, some features may include additional metals. For example, the die attach pad 412 may be plated and/or coated with additional metals and/or other materials to make the die attach pad 412 more suitable for mounting an LED chip 414. For example, the die attach pad 412 may be plated with additional layers such as, for example, additional adhesive, bonding, reflector and/or barrier layers (not shown).

As illustrated in FIG. 7A, the first meniscus control feature 410, second meniscus control feature 420 and third meniscus control feature 430 may be generally circular in shape. Accordingly, the region 415 defined between the first meniscus control feature 410 and the second meniscus control feature 420 may be generally annular or ring-shaped. An encapsulant material may be deposited in an annular region 415 in for example, a circular pattern, by moving a dispensing needle in a circular motion as discussed in more detail below. In this manner, the desired pattern may be "drawn" onto the substrate with the needle.

Other shapes may be possible for the first, second and third meniscus control features 410, 420, 430. For example, the meniscus control features could be generally oval and/or rectangular in shape. In some embodiments, the meniscus control features may be continuous features formed on the upper surface of the substrate 402. If the meniscus control features are not continuous features, encapsulant material dispensed within regions defined by the meniscus control features may be more likely to fail to be confined within a desired region.

Figure 7B:
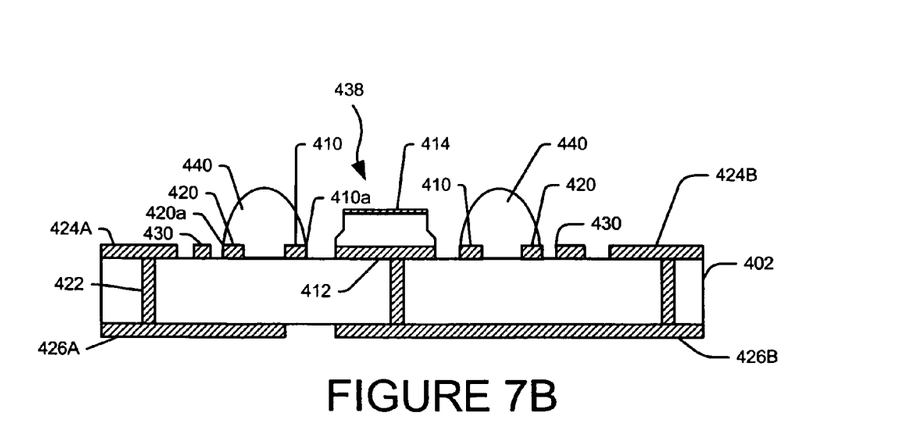
FIGS. 7B to 7D are a cross-sectional side views illustrating the formation of a light emitting device package according to further embodiments of the present invention.

As illustrated in FIG. 7B, a first encapsulant material 440 may be dispensed within the region 415 defined by the first meniscus control feature 410 and the second meniscus control feature 420. As illustrated in FIG. 7B, the first encapsulant material 440 may cling to a corner 410a of the first meniscus control feature 410 and a corner 420a of the second meniscus control feature 420 that are distant from the center of region 415. That is, when it is dispensed, the encapsulant material 440 may flow outward until it reaches an outer corner of the respective first and second meniscus control features 410, 420 where it may be held in place, for example, by surface tension.

When cured, the first encapsulant material 440 may have a first index of refraction. For example, a number of optically transparent, curable silicone materials are available from Dow Corning Corporation having indices of refraction ranging from 1.394 to 1.539 depending on the type of material and the cure conditions. In some embodiments, the first encapsulant material 440 may have an index of refraction of about 1.4

The dispensed first encapsulant material 440 may be cured, for example, by heating the encapsulant material for a suitable period of time at a suitable temperature, by allowing the dispensed encapsulant to sit for a suitable period of time at room temperature, by exposure to UV light, and/or with the aid of a catalyst. It will be appreciated that a cure step may include a full and/or partial curing of an encapsulant material. A full cure may cause the liquid encapsulant material to harden completely, while a partial cure may cause the liquid encapsulant to only partially harden. For example, it may be desirable to partially cure a dispensed liquid encapsulant sufficient to permit a subsequent dispense and/or other process steps to be performed. A full cure may be performed after some or all subsequent dispenses have been performed. Alternatively, it may be desirable to perform a full cure after each dispense step.

The cured first encapsulant material 440 may thereby form a hardened, optically transparent ring surrounding the first encapsulant region 405 including the die attach pad 412 and the LED chip 414 mounted thereon, and having a first index of refraction. In some embodiments, the first encapsulant material 440 may define a cavity 438 surrounding the LED chip 414. The height of the first encapsulant material 440 may be greater than, equal to, or less than the height of the mounted LED chip 414 on the die attach pad 412.

Figure 7C:
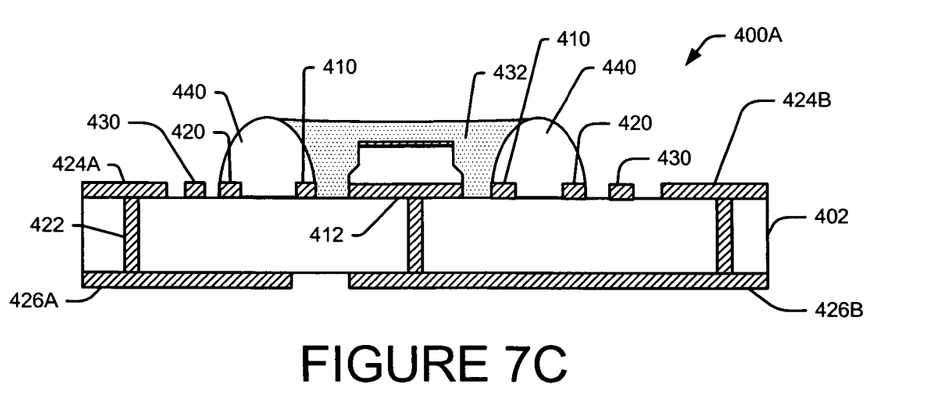

As illustrated in FIG. 7C, a second encapsulant material 432 may be dispensed into the cavity 438 defined by the first encapsulant material 440. In some embodiments, the second encapsulant material 432 may include a wavelength conversion material, such as a phosphor and/or nanocrystal. The dispensed second encapsulant material 432 may be cured in the manner described above. The second encapsulant material 432 may have a second index of refraction. The second index of refraction may be the same as or different from the first index of refraction of the first encapsulant material 440. In some embodiments, the second index of refraction may be about 1.5. Accordingly, a completed package 400A is formed as shown in FIG. 7C.

Figure 7D:
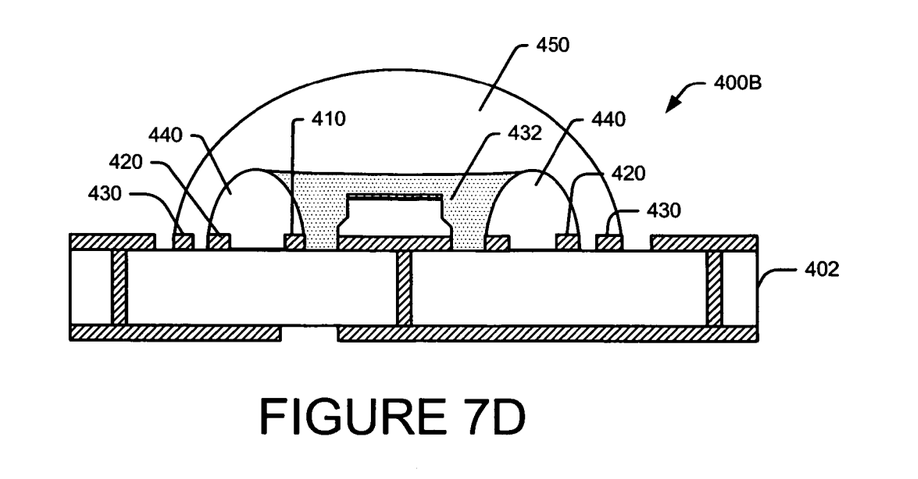

As illustrated in FIG. 7D, an optional third encapsulant material 450 may be dispensed within the third encapsulant region 425 (i.e. covering the first encapsulant material 440 and/or the second encapsulant material 432). The third encapsulant material 450 may form a domed meniscus lens above the LED chip 414, the first encapsulant material 440 and the second encapsulant material 432 in the package 400B. The dispensed third encapsulant material 450 may be cured as described above. The third encapsulant material may have a third index of refraction. The third index of refraction may be different from the first index of refraction of the first encapsulant material 440. The third index of refraction may be the same as or different from the second index of refraction of the second encapsulant material 432. In some embodiments, the third index of refraction may be about 1.5. Accordingly, in some embodiments of the invention, the first encapsulant material 440, the second encapsulant material 432 and the third encapsulant material 450 may form a composite lens having different indices of refraction. In particular, the first encapsulant material 440 may form a toroidal side lens having a lower index of refraction than a core lens formed by the second encapsulant material 432 and the third encapsulant material 450.

Figure 8:
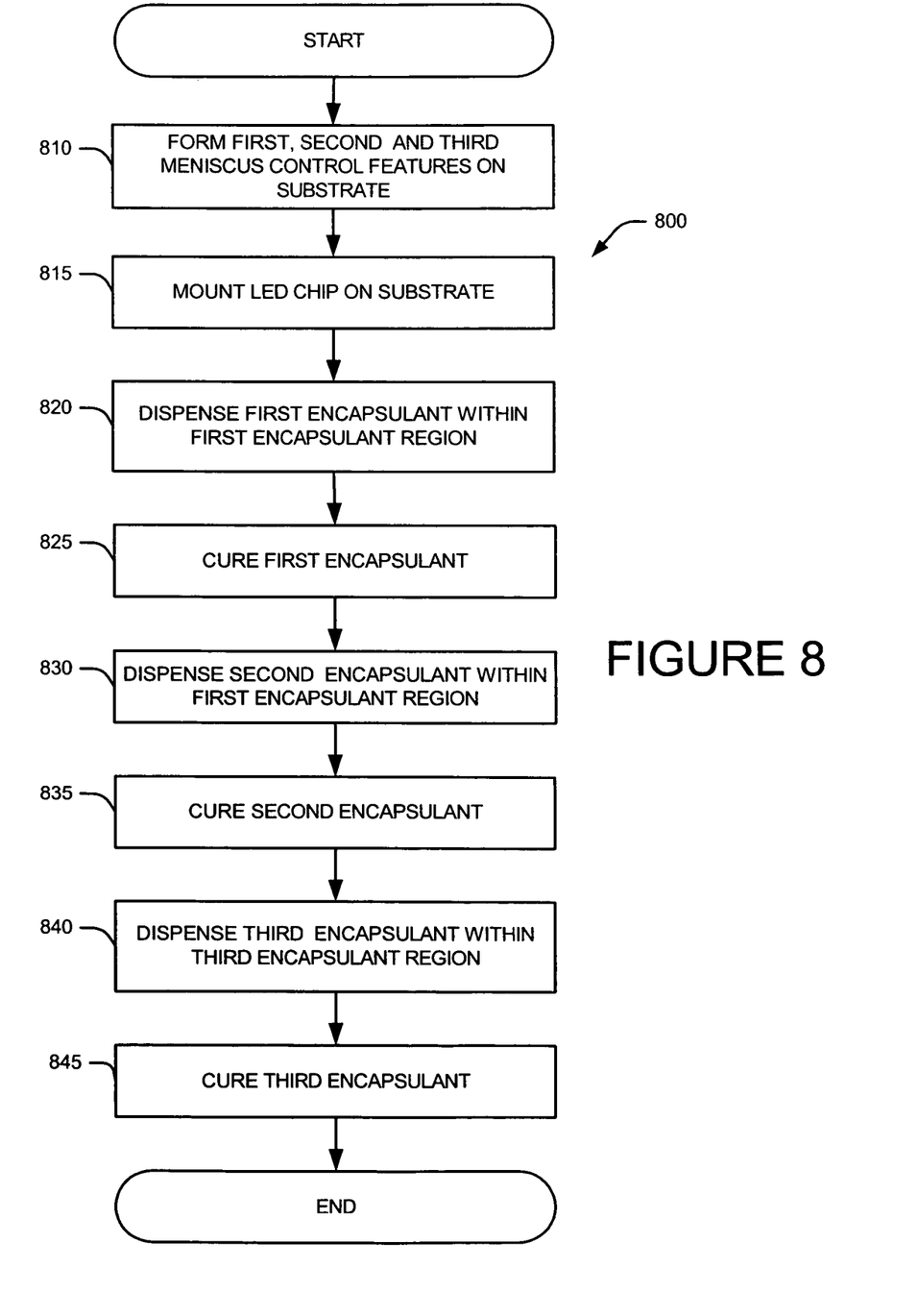
FIG. 8 is a flowchart illustrating operations for packaging a light emitting device according to some embodiments of the present invention.

Referring now to FIG. 8, some methods 800 of forming a packaged LED according to some embodiments of the invention are illustrated that include depositing a metal layer on a substrate 402 and patterning the metal layer to form a die attach pad 412, a first meniscus control feature 420, a second meniscus control feature 420 and a third meniscus control feature 430 (block 810). As discussed above, the first meniscus control feature 410 may surround the die attach pad 412 and define a first encapsulant region 405 of the upper surface of the substrate 402. The second meniscus control feature 420 may surround the first encapsulant region 405 and define an annular second encapsulant region 415 of the upper surface of the substrate 402. The third meniscus control feature 430 surrounds the first encapsulant region 405 and the second encapsulant region 415. It will be understood that for a feature to "surround" a region, the feature need not be continuously formed around the region. Although the figures illustrate continuous features, it may be possible for a meniscus control feature to include gaps or voids therein which do not affect the meniscus control function of the feature.

The methods 800 may further include mounting an LED chip 414 on the die attach pad 412 (block 815) and dispensing a first encapsulant material 440 within the annular second encapsulant region 415 defined by the first meniscus control feature 410 and the second meniscus control feature 429 (block 820). The first encapsulant material 440 has a first index of refraction that may be, for example, about 1.4. The dispensed first encapsulant material 440 may be at least partially cured (block 825) and a second encapsulant material 432 is dispensed onto the substrate 110 within the first encapsulant region 505 (block 830). The dispensed second encapsulant material 432 may be at least partially cured (block 835). The second encapsulant material 432 may have a second index of refraction that may be the same as or different from the first index of refraction of the first encapsulant material 440. In some embodiments, the second index of refraction may be about 1.5.

Continuing with the discussion of FIG. 8, the methods 800 may further include dispensing a third encapsulant material 450 within the third encapsulant region 425 (block 840), and curing the third encapsulant material 450 (block 845).

As illustrated above, the dispensed first encapsulant material 440 may define a cavity 438 around the LED chip 414, and dispensing the second encapsulant material 432 may include dispensing the second encapsulant material 432 into the cavity 438 around the LED chip 414 after at least partially curing the first encapsulant material 440. The first encapsulant material 440, the second encapsulant material 432 and/or the third encapsulant 450 material may include a wavelength conversion material.

The third encapsulant material may have a third index of refraction that may be different from the first index of refraction of the first encapsulant material 440. The third index of refraction may be the same as or different from the second index of refraction of the second encapsulant material 432. In some embodiments, the third index of refraction may be about 1.5. Accordingly, in some embodiments of the invention, the first encapsulant material 440, the second encapsulant material 432 and the third encapsulant material 450 may form a composite lens having different indices of refraction. In particular, the first encapsulant material 440 may form a toroidal side lens having a lower index of refraction than a core lens formed by the second encapsulant material 432 and the third encapsulant material 450.

Packaged light emitting devices according to embodiments of the invention may be utilized as solid state light sources in various applications, such as illumination and/or backlighting applications. For example, packaged light emitting devices 500 according to embodiments of the invention may be assembled onto a tile 510 as illustrated in FIG. 9.

The solid state lighting tile 510 may be used as a functional building block to create a large area planar light source. However, it will be understood that a large area planar light source may include only one tile. A solid state lighting tile 510 may include thereon a number of solid state lighting elements 500 arranged in a regular and/or irregular one- or two-dimensional array. The tile 510 may include, for example, a printed circuit board (PCB) on which one or more circuit elements, such as discrete light emitting components, may be mounted. In particular, a tile 510 may include a metal core PCB (MCPCB) including a metal core having thereon a polymer coating on which patterned metal traces (not shown) may be formed. MCPCB material, and material similar thereto, is commercially available from, for example, The Bergquist Company. The PCB may further include heavy clad (4 oz. copper or more) and/or conventional FR-4 PCB material with thermal vias. MCPCB material may provide improved thermal performance compared to conventional PCB material. However, MCPCB material may also be heavier than conventional PCB material, which may not include a metal core.

Figure 9:
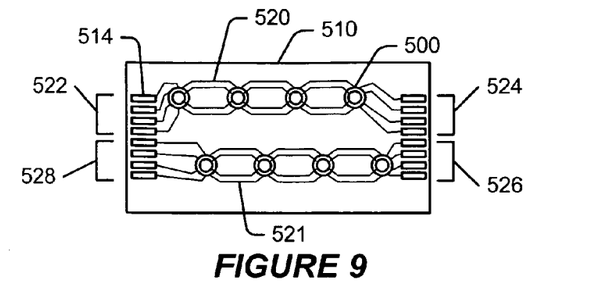
FIG. 9 is a schematic illustration of a tile for solid state lighting including a packaged light emitting device according to some embodiments of the invention.

In the embodiments illustrated in FIG. 9, the lighting elements 500 are multi-chip clusters including four solid state emitting devices per cluster. In the tile 510, four lighting elements 500 are serially arranged in a first path or string 520, while four lighting elements 500 are serially arranged in a second path or string 521. The lighting elements 500 of the first string 520 are connected, for example via printed circuits, to a set of four anode contacts 522 arranged at a first end of the tile 510, and a set of four cathode contacts 524 arranged at a second end of the tile 510. The lighting elements 500 of the second string 521 are connected to a set of four anode contacts 526 arranged at the second end of the tile 510, and a set of four cathode contacts 528 arranged at the first end of the tile 510.

In some embodiments of the invention, the lighting elements 500 are configured to emit in the blue or UV spectrum.

A wavelength conversion material is arranged to receive light emitted by the LEDs and to responsively emit a longer wavelength light, such as a red, green, blue and/or yellow light. The emitted light may combine with other light to produce a white light. In some embodiments, the lighting elements 500 include blue LEDs and a wavelength conversion material including at least a yellow phosphor. As is known in the art, yellow light emitted by the phosphor may combine with unconverted blue light emitted by the LEDs to produce a white light. A lighting element 500 may further include a red-emitting phosphor. Red light from the red emitting phosphor may combine with the blue and yellow light emitted by the LEDs and the yellow phosphor, respectively, to produce a warmer white light having better color rendering characteristics.

The solid state lighting elements 500 may include, for example, organic and/or inorganic light emitting devices including multiple index lenses as described above.

Figure 10:
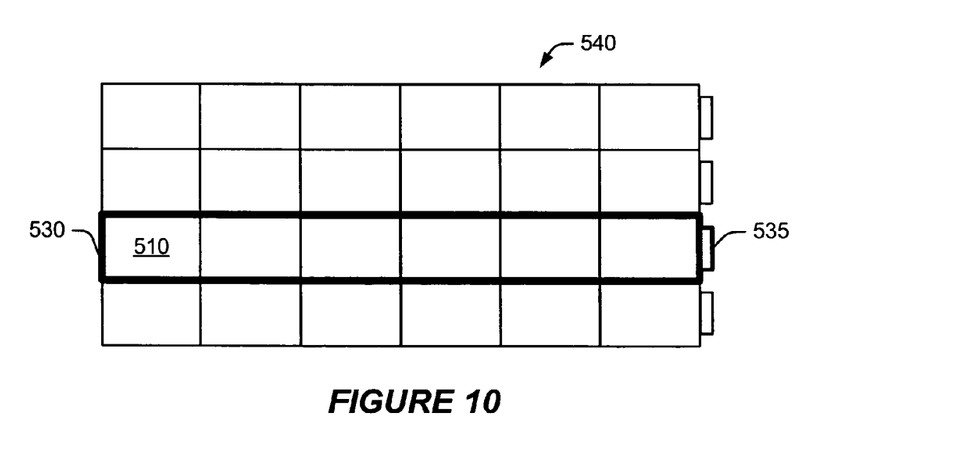
FIG. 10 is a schematic illustration of a solid state lighting panel including a packaged light emitting device according to some embodiments of the invention.

Multiple tiles 510 may be assembled to form a larger lighting bar assembly 530 as illustrated in FIG. 10. As shown therein, a bar assembly 530 may include two or more tiles connected end-to-end. Accordingly, referring to FIGS. 9 and 10, the cathode contacts 524 of the first string 520 of the leftmost tile 510 of the bar assembly 530 may be electrically connected to the anode contacts 522 of the first string 520 of the adjacent tile 510, and so forth. Similarly, the anode contacts 526 of the second path 521 of the leftmost tile 510 of the bar assembly 530 may be electrically connected to the cathode contacts 528 of the second string 521 of the adjacent tile 510.

Furthermore, the cathode contacts 524 of the first string 520 of the rightmost tile 510 of the bar assembly 530 may be electrically connected to the anode contacts 526 of the second string 521 of the rightmost tile 510 of the bar assembly 530 by a loopback connector 535. In this manner, the first string 520 may be connected in series with the second string 521 to form a single string of LEDs, such as LEDs of a single color. The other strings of the paths 520, 521 of the tiles 510 may be connected in a similar manner.

The loopback connector 535 may include an edge connector, a flexible wiring board, or any other suitable connector. In addition, the loopback connector 535 may include printed traces formed on/in the tile 510.

While the bar assembly 530 shown in FIG. 10 is a one dimensional array of tiles 510, other configurations are possible. For example, the tiles 510 could be connected in a two-dimensional array in which the tiles 510 are all located in the same plane, or in a three dimensional configuration in which the tiles 510 are not all arranged in the same plane. Furthermore the tiles 510 need not be rectangular or square, but could, for example, be hexagonal, triangular, or the like.

Still referring to FIG. 10, in some embodiments, a plurality of bar assemblies 530 may be combined to form a lighting panel 540, which may be used, for example, as a planar illumination source for general illumination, as a backlight source for display backlighting, or for other purposes. As shown in FIG. 10, a lighting panel 540 may include four bar assemblies 530, each of which includes six tiles 510. The rightmost tile 510 of each bar assembly 530 includes a loopback connector 535. Accordingly, each bar assembly 530 may include multiple strings of LEDs (e.g., one red, two green and one blue).

In some embodiments, a bar assembly 530 may include four LED strings (one red, two green and one blue). Thus, a lighting panel 540 including nine bar assemblies 530 may have 36 separate strings of LEDs. Moreover, in a bar assembly 530 including six tiles 510 with eight solid state lighting elements 500 each, an LED string may include 48 LEDs connected in serial.

Figure 11:
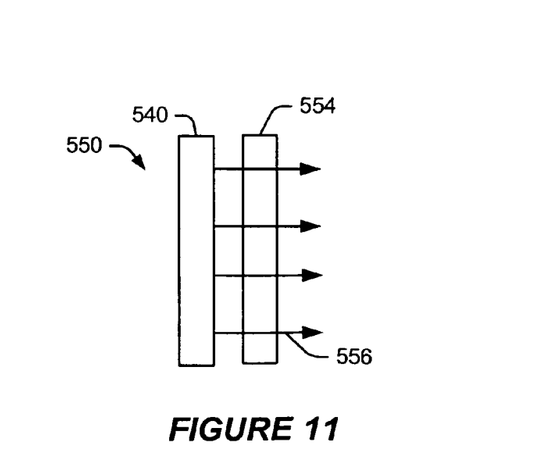
FIG. 11 is a schematic illustration of a display unit having a backlight including a packaged light emitting device according to some embodiments of the invention.

Referring to FIG. 11, a lighting panel 540 according to some embodiments of the invention may be used as a backlight for a display such as a liquid crystal display (LCD) 550. Systems and methods for controlling solid state backlight panels are described, for example, in U.S. patent application Ser. No. 11/368,976, entitled "Adaptive Adjustment of Light Output of Solid State Lighting Panels", filed Mar. 6, 2006 (Attorney Docket 5308-632), which is assigned to the assignee of the present invention and the disclosure of which is incorporated herein by reference in its entirety. As shown in FIG. 11, an LCD 550 may include a lighting panel 540 that is positioned relative to an LCD screen 554 such that light 556 emitted by the lighting panel 540 passes through the LCD screen 554 to provide backlight for the LCD screen 554. The LCD screen 554 includes appropriately arranged shutters and associated filters that are configured to selectively pass/block a selected color of light 556 from the lighting panel 540 to generate a display image.

Figure 12:
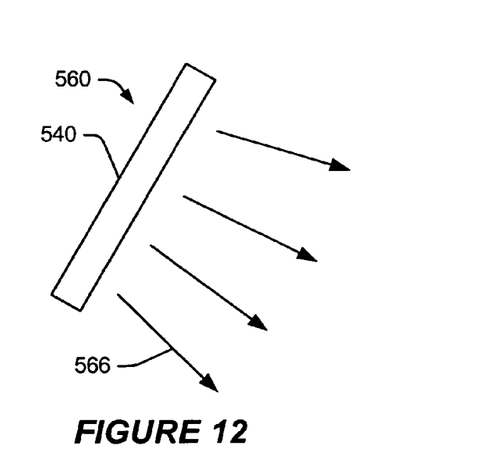
FIG. 12 is a schematic illustration of a solid state luminaire including a packaged light emitting device according to some embodiments of the invention.

Referring to FIG. 12, a lighting panel 540 according to some embodiments of the invention may be used as a lighting panel for a solid state lighting fixture or luminaire 560. Light 566 emitted by the luminaire 560 may be used to illuminate an area and/or an object. Solid state luminaires are described, for example, in U.S. patent application Ser. No. 11/408,648, entitled "Solid State Luminaires for General Illumination", filed Apr. 21, 2006, which is assigned to the assignee of the present invention and the disclosure of which is incorporated herein by reference in its entirety.

The flowchart of FIG. 8 and the schematic illustrations of FIGS. 2-7 and 9-12 illustrate the functionality and operation of possible implementations of methods for packaging a light emitting device according to some embodiments of the present invention. It should be noted that, in some alternative implementations, the acts noted in describing the figures may occur out of the order noted in the figures. For example, two blocks/operations shown in succession may, in fact, be executed substantially concurrently, or may be executed in the reverse order, depending upon the functionality involved.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

The invention claimed is:

1. A packaged light emitting device, comprising:
a substrate;
a solid state light emitting device on the substrate;
a first lens on the substrate and defining a cavity and having a first index of refraction; and
a second lens positioned at least partially within the cavity formed by the first lens and having a second index of refraction that is different from the first index of refraction;
wherein the first lens comprises a molded lens, and wherein the second index of refraction is higher than the first index of refraction;
wherein the first lens comprises a convex mating surface on an inside surface of the first lens and the second lens comprises a concave mating surface on an outside surface of the second lens, wherein the convex mating surface of the first lens matches a shape of the concave mating surface of the second lens.

2. The packaged light emitting device of claim 1, further comprising an encapsulant material between the solid state light emitting device and the second lens.

3. The packaged light emitting device of claim 1, wherein the substrate comprises a leadframe or a printed circuit board, wherein the packaged light emitting device further comprises a molded body on the substrate, and wherein the first lens is on the molded body.

4. The packaged light emitting device of claim 3, wherein the molded body includes at least one surface that extends along a surface of the substrate and at least one vertical sidewall extending from the surface and defining a mounting location for the first lens.

5. The packaged light emitting device of claim 3, wherein the molded body extends at least partially through the leadframe.

6. The packaged light emitting device of claim 1, wherein the first lens includes a first mating surface and the second lens includes a second mating surface that is in contact with the first mating surface of the first lens.

7. The packaged light emitting device of claim 1, wherein the second lens is attached to the first lens using an adhesive encapsulant.

8. The packaged light emitting device of claim 7, wherein the adhesive encapsulant has an index of refraction that is substantially the same as the first index of refraction or the second index of refraction.

9. The packaged light emitting device of claim 1, further comprising a third lens positioned on the second lens and having a third index of refraction.

10. The packaged light emitting device of claim 9, wherein the third index of refraction is higher than the first index of refraction.

11. The packaged light emitting device of claim 10, wherein the third index of refraction is higher than the second index of refraction.

12. The packaged light emitting device of claim 10, wherein the third index of refraction is higher than the first index of refraction and is the same as the second index of refraction.

13. A solid state luminaire comprising a packaged light emitting device as recited in claim 1.

14. A backlight panel for a display comprising a packaged light emitting device as recited in claim 1.

15. The packaged light emitting device of claim 1, wherein both the first lens and the second lens comprise silicone.

16. A lens for a packaged light emitting device, comprising:
a generally toroidal side lens defining a cavity therein and having a first index of refraction and including a convex mating surface on an inside surface of the side lens; and
a core lens positioned at least partially within the cavity formed by the side lens and having a second index of refraction that is different from the first index of refraction and having a concave mating surface on an outside surface of the core lens, wherein the convex mating surface of the side lens matches a shape of the concave mating surface of the core lens.

17. The lens of claim 16, wherein the second index of refraction is higher than the first index of refraction.

18. The lens of claim 16, further comprising a third lens positioned on the second lens and having a third index of refraction.

19. The lens of claim 18, wherein the third index of refraction is higher than the first index of refraction.

20. The lens of claim 19, wherein the third index of refraction is higher than the second index of refraction.

21. The lens of claim 19, wherein the third index of refraction is higher than the first index of refraction and is the same as the second index of refraction.

22. The lens of claim 16, wherein both the side lens and the core lens comprise molded silicone.

* * * * *

UNITED STATES PATENT AND TRADEMARK OFFICE
CERTIFICATE OF CORRECTION

PATENT NO. : 7,646,035 B2  Page 1 of 1
APPLICATION NO. : 11/443741
DATED : January 12, 2010
INVENTOR(S) : Loh et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 564 days.

Signed and Sealed this

Sixteenth Day of November, 2010

David J. Kappos
*Director of the United States Patent and Trademark Office*